United States Patent [19]
Ono et al.

[11] Patent Number: 5,462,635
[45] Date of Patent: Oct. 31, 1995

[54] SURFACE PROCESSING METHOD AND AN APPARATUS FOR CARRYING OUT THE SAME

[75] Inventors: Tetsuo Ono, Kokubunji; Tatsumi Mizutani, Koganei; Keizo Suzuki, Kodaira, all of Japan

[73] Assignee: Hitachi, Ltd., Tokyo, Japan

[21] Appl. No.: 251,660

[22] Filed: May 31, 1994

Related U.S. Application Data

[63] Continuation of Ser. No. 827,394, Jan. 29, 1992, abandoned.

[30] Foreign Application Priority Data

Jan. 29, 1991 [JP] Japan ................................. 3-008916

[51] Int. Cl.⁶ ............................................ H01L 21/00
[52] U.S. Cl. .......................... 216/67; 156/345; 156/643.1; 427/551; 427/457; 204/192.34; 204/298.36
[58] Field of Search ...................... 156/345, 643; 204/192.34, 298.36; 118/723 MR; 427/551, 457

[56] References Cited

U.S. PATENT DOCUMENTS

| | | | |
|---|---|---|---|
| 4,579,609 | 4/1986 | Reif et al. .................... | 148/175 |
| 4,734,152 | 3/1988 | Geis et al. .................... | 156/656 |
| 5,110,407 | 5/1992 | Oro et al. ..................... | 156/345 |

FOREIGN PATENT DOCUMENTS

| | | |
|---|---|---|
| 224360 | 6/1987 | European Pat. Off. . |
| 407088 | 1/1991 | European Pat. Off. . |
| 474140 | 3/1992 | European Pat. Off. . |
| 488393 | 6/1992 | European Pat. Off. . |
| 61-113775 | 5/1986 | Japan . |
| 61-141141 | 6/1986 | Japan . |
| 62-030324 | 2/1987 | Japan . |
| 62-030891 | 2/1987 | Japan . |
| 62-259443 | 11/1987 | Japan . |
| 63-090132 | 4/1988 | Japan . |
| 63-224224 | 9/1988 | Japan . |
| 02001913 | 1/1990 | Japan . |
| 02081430 | 3/1990 | Japan . |

OTHER PUBLICATIONS

"Neutral-Beam-Assisted Etching of $SiO_2$/-a Charge-Free Etching Process"; Jpn. J. Appl. Phys. 1; Mizatani et al.; Oct. 1990; vol. 29; No. 10; pp. 2220-2222.

Roy et al, "Synthesis of High-Quality Ultra-Thin Gate Oxides for ULSI Applications", AT&T Technical Journal, vol. 67, No. 6, Nov. 1988, pp. 155-174.

L. M. Ephrath, "Two-Step Dry Process for Delineating Micron and Submicron Dimension Polysilicon Gates", IBM Technical Disclosure Bulletin, vol. 21, No. 10, Mar. 1979, p. 4236.

Japan. J. Appl. Phys., vol. 12, (1973), No. 1, "Etching Characteristics of Silicon and its Compounds by Gas Plasma", Abe et al, pp. 154-155.

*Primary Examiner*—R. Bruce Breneman
*Assistant Examiner*—George Goudreau
*Attorney, Agent, or Firm*—Fay, Sharpe, Beall, Fagan, Minnich & McKee

[57] ABSTRACT

A surface processing method capable of processing the surface of a work at a high processing rate without damaging the surface of the work uses, in combination, a fast processing technique using charged particles and a moderate processing technique using neutral particles that scarcely damage the surface of the work, and a surface processing apparatus suitable for carrying out the surface processing method. In carrying out a surface treatment process, the substrate is processed in a moderate surface processing mode using neutral particles while the substrate is exposed substantially to charged particles, and the substrate is processed in a fast surface processing mode using charged particles while the substrate is not exposed substantially to charged particles to achieve the surface treatment process at a high processing rate without damaging the surface of the substrate.

3 Claims, 2 Drawing Sheets

SURFACE PROCESSING METHOD AND AN APPARATUS FOR CARRYING OUT THE SAME

This is a continuation application of Serial No. 07,827,394, filed Jan. 29, 1992, now abandoned.

BACKGROUND OF THE INVENTION

The present invention relates to a surface processing method and an apparatus for carrying out the same and, more particularly, to an improved surface processing method capable of processing the surface of a solid article, such as a semiconductor work or a metal work, at a high processing speed without significantly damaging the surface of the solid work, and to an apparatus suitable for carrying out the surface processing method.

A plasma has often been used in forming a minute pattern on the surface of a semiconductor work by etching. A dry etching process disclosed, for example, in Japan. J. Appl. Phys., Vol. 12, No. 1, p.154 (1973) produces a plasma of $CF_4$ by means of electromagnetic waves of 13.6 MHz, and etches Si or $SiO_2$ using the plasma. This dry etching process is advantageous over the conventional wet etching process in forming a minute pattern on a semiconductor substrate, but has a problem that the semiconductor substrate is damaged by charged particles contained in the plasma.

To obviate damages attributable to the charged particles, etching processes employing electrically neutral particles are disclosed in Japanese Patent Laid-open (Kokai) Nos. Sho 61-113775 and Sho 62-259443. The etching process disclosed in Japanese Patent Laid-open (Kokai) No. Sho 61-113775 employs a molecular beam produced by thermally exciting molecules of chloride or the like by heating in a furnace for etching. The etching process disclosed in Japanese Patent Laid-open (Kokai) No. Sho 62-259443 etches a substrate by promoting the interaction between a halogen gas and the substrate by the kinetic energy of neutral particles obtained by neutralizing Ar ions or the like produced in a plasma through charge exchange. Although these prior art etching processes are able to avoid damaging the substrate by the electric charge of the charged particles, the etching rate of these prior art etching processes is in the range of a tenth to a hundredth of the conventional etching process using a plasma.

SUMMARY OF THE INVENTION

It is an object of the present invention to provide a surface processing method capable of achieving etching at a relatively high processing rate without entailing damages attributable to charged particles in the substrate.

Another object of the present invention is to provide a surface processing apparatus suitable for carrying out the foregoing surface processing method.

To achieve the object, the present invention uses, in dexterous combination, a fast surface processing method employing charged particles, namely, a surface processing technique capable of processing the surface of work at a high processing rate, and a moderate surface processing method employing neutral particles, namely, a surface processing technique capable of processing the surface of a work at a moderate processing rate without significantly damaging the work, for processing the surface of a work. The present invention processes the surface of a work by the moderate surface processing method when the substrate of the work is exposed substantially to charged particles, and processes the surface of the work by the fast surface processing method when the substrate of the work is not exposed substantially to charged particles.

The surface processing method in accordance with the present invention is carried out by a surface processing apparatus having both an ability to process the surface of a work at a high processing rate with charged particles, and an ability to process the surface of the work at a moderate processing rate with neutral particles without causing significant damages in the substrate of the work.

In etching a layer of a functional material formed on a substrate, the layer is etched at a high etching rate with charged particles in the initial etching stage, and only very thin portions of the layer remaining in the final etching stage are etched with neutral particles. In such an etching process, the surface of the substrate underlying the layer of the functional material is protected from charged particles by the layer of the functional material and hence the surface of the substrate is not damaged. Since the fast etching process is terminated and the moderate etching process is started immediately before the thickness of the layer of the functional material is reduced to an extent in which damages occur in the surface of the substrate, the surface of the substrate is not damaged in the rest of the etching period. Since the moderate etching process employing neutral particles is executed only for etching the very thin portions of the layer, the time required for the moderate etching process is very short. Thus, fast etching can be achieved without significantly damaging the substrate.

The surface processing method may be carried out by either a novel, unique, integrated surface processing apparatus having both an ability to etch a work, at a high etching rate with charged particles and an ability to etch the work at a moderate rate with neutral particles without significantly damaging the substrate of the work, or a composite surface processing apparatus consisting of a surface processing unit employing charged particles for fast etching and a surface processing unit employing neutral particles for moderate etching. Naturally, it is desirable to construct the surface processing apparatus, either the integrated surface processing apparatus or the composite surface processing apparatus, so that the work can undergo continuously both the fast etching process employing charged particles and the moderate etching process employing neutral particles without being exposed to the atmosphere between the fast etching process and the moderate etching process.

The above and other objects, features and advantages of the present invention will become more apparent from the following description taken in connection with the accompanying drawings.

DESCRIPTION OF THE PREFERRED EMBODIMENTS

First Embodiment

Figure 1:
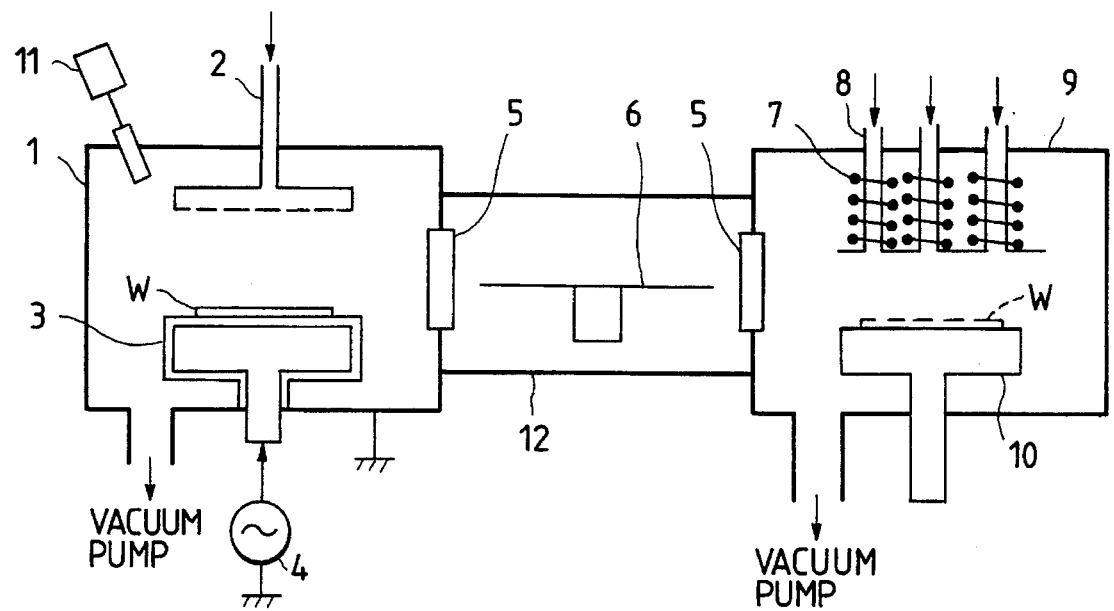
FIG. 1 is a diagrammatic view of a surface processing apparatus in a first embodiment according to the present invention.

Referring to FIG. 1, a surface processing apparatus in a first embodiment according to the present invention has a processing chamber 1 for fast etching using a plasma, a processing chamber 9 for moderate etching using neutral particles, and an intermediate chamber 12 interconnecting the processing chambers 1 and 9, and provided with a work transporting mechanism. A work W such as is formed by forming a $SiO_2$ layer (base layer) on a semiconductor wafer, and forming a Si layer (objective layer of a functional material) over the $SiO_2$ layer, is transferred from the processing chamber 1 to the processing chamber 9 through the intermediate chamber 12 by the work transporting mechanism to subject the work W continuously to fast etching and moderate etching without exposing the same to the atmosphere.

An etching process for etching the Si layer formed over the $SiO_2$ layer formed over the surface of the semiconductor wafer will be described by way of example. In this description, the base layer is a layer underlying the layer of a functional material to be subjected to etching and, in this example, it is to be noted that the $SiO_2$ layer is the base layer.

Referring to FIG. 1, the work W is mounted on a work support table 3 disposed within the processing chamber 1, and then an etching gas containing a halogen, such as $CF_4$ gas, is supplied through a gas inlet 2 into the processing chamber 1. In this state, 13.6 MHz electromagnetic waves are generated in the processing chamber 1 to produce a plasma by high-frequency discharge within the processing chamber 1. The etching gas is decomposed by the plasma to produce free radicals of the halogen (fluorine in this example). The Si layer is thus etched by the free radicals of the halogen.

Charged particles produced in the plasma and falling on the Si layer also contribute to the etching of the Si layer. However, the charged particles are unable to reach the $SiO_2$ layer underlying the Si layer because the charged particles are intercepted by the Si layer, so that the $SiO_2$ layer is not damaged by the charge of the charged particles.

During the progress of the fast plasma etching process in the processing chamber 1, the thickness of the Si layer is monitored with an interference film thickness meter 11. As soon as the Si layer has been etched to a very small thickness, the supply of high-frequency power to the processing chamber 1 is stopped, and then the work W is transferred from the work support table 3 to a work support table 10 disposed within the processing chamber 9, in which a hatch 5A of the processing chamber 1 is opened, the work W is placed on the work transporting mechanism 6, a hatch 5B of the processing chamber 9 is opened after closing the hatch 5A, and then the work W is transported onto the work support table 10 disposed in the processing chamber 9 by the work transporting mechanism 6. The processing chamber 9 and the intermediate chamber 12 are evacuated before transferring the work W from the processing chamber 1 to the processing chamber 9 so that the transfer is performed without exposing the work W to the atmosphere.

After the work W has thus been transferred from the work support table 3 to the work support table 10, a gas containing a halogen, such as chlorine, is supplied through nozzles 8 provided respectively with heaters 7 into the processing chamber 9 after closing the hatch 5B of the processing chamber 9. The heaters 7 heat the gas to activate the gas thermally while the same flows through the nozzles 8. The thermally excited gas is highly reactive and is capable of etching the Si layer. However, since the thermally excited gas is not charged, the $SiC_2$ layer underlying the Si layer is not damaged by the thermally excited gas. Further, the thermally excited gas enables highly anisotropic etching.

The timing of changing the etching mode from fast plasma etching in the processing chamber 1 to moderate etching using neutral particles in the processing chamber 9 is dependent on the composition of the functional material forming the objective layer to be etched and etching conditions. Generally, it is desirable to terminate the fast plasma etching process in the processing chamber 1 and start the moderate etching process using neutral particles in the processing chamber 9 when the objective layer is etched to a thickness in the range of about 10 nm to about 100 nm. It is also possible to change the etching mode upon the elapse of a predetermined time required for etching the Si layer to a predetermined thickness if the time required for removing the objective layer entirely by the fast plasma etching process in the processing chamber 1 is known. In such a case, the thickness of the Si layer need not be monitored by the interference film thickness meter 11.

Although the work support table 3 in this embodiment serves also as an electrode for applying the high-frequency power to the processing chamber 1, the processing chamber 1 may be provided with a separate electrode for such a purpose. It is also possible to apply high-frequency power to the processing chamber 1 through a high-frequency power supply coil or a waveguide.

The surface processing method has been described as applied to etching the Si layer formed over the $SiO_2$ layer by the surface processing apparatus shown in FIG. 1. A surface processing method as applied to a thin film forming process for forming an objective layer over a base layer by the same surface processing method will be described hereinafter.

A $SiO_2$ layer (objective layer) is formed over the surface of a work W of Si (Si wafer). Since the surface of the work W is exposed in the initial stage of the thin film forming process, the $SiO_2$ layer is formed over the work W in a moderate thin film forming mode in the initial stage of the thin film forming process.

First, the work W of Si (Si wafer) is mounted on the work support table 10 of the processing chamber 9, and then oxygen gas is supplied through the nozzles 8 into the processing chamber 9, heating the oxygen gas by the heaters 7. The heated highly reactive oxygen gas then oxidizes the surface of the work W of Si to form a thin $SiO_2$ film over the surface of the work W. Although the film forming rate of the moderate thin film forming process is lower than that of an oxide film forming process using charged particles, the moderate thin film forming process does not damage the work W.

Subsequently, the work W is transferred from the processing chamber 9 to the processing chamber 1, in which the surface of the work W is further oxidized by using an oxygen plasma produced by ionizing oxygen gas supplied through the gas inlet 2 into the processing chamber 1.

Although charged particles contained in the oxygen plasma fall on the surface of the work W, the charged particles are unable to reach the Si surface of the work W because the charged particles are intercepted by the thin $SiO_2$ film formed by the moderate thin film forming process in the processing chamber 9 and hence the Si surface of the work W is not damaged. Thus, since oxidizing rate in the oxidizing process using the oxygen plasma is higher than that in the oxidizing process performed in the processing chamber by using the neutral particles, a desired $SiO_2$ film can be formed at a relatively high oxidizing rate.

Second Embodiment

Figure 2:
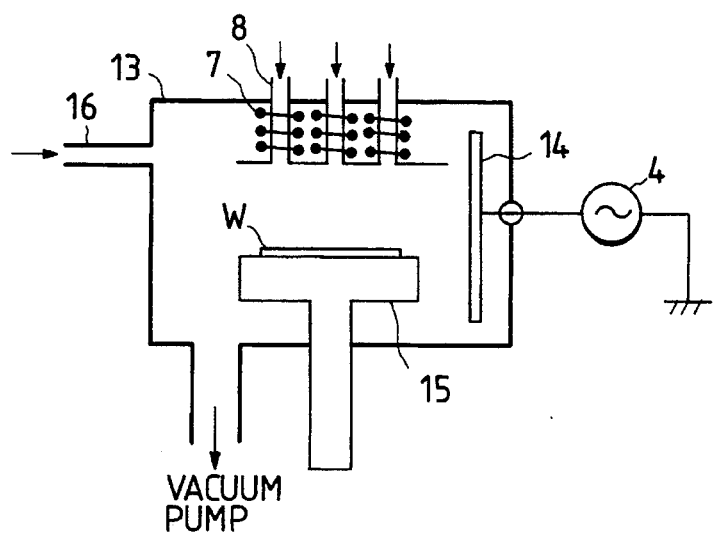
FIG. 2 is a diagrammatic view of a surface processing apparatus in a second embodiment according to the present invention.

Referring to FIG. 2, a surface processing apparatus in a second embodiment according to the present invention has a single processing chamber 13 capable of functioning both in a processing mode using charged particles and a processing mode using neutral particles. Accordingly, a work can be subjected to both fast surface processing and moderate surface processing in the processing chamber 13.

A work W such as may be formed by forming an objective layer to be etched on a semiconductor wafer is held fixedly on a work support table 15 throughout a surface treatment process. In etching the surface of the work W, for instance, a reactive gas is supplied through a gas inlet 16 into the processing chamber 13 and high-frequency power is applied to an electrode 14 to produce a plasma in the processing chamber 13 by high-frequency discharge. The objective layer forming the surface of the work W is then exposed to the plasma for fast etching.

After the objective layer has been etched to a sufficiently small thickness, the electrode 14 is disconnected from a high-frequency power source 4 and the supply of the reactive gas through the gas inlet 16 is stopped. Then, a reactive gas is supplied through nozzles 8, which are respectively provided with heaters 7, into the processing chamber 13. While flowing through the nozzles 8, the reactive gas is heated and thermally excited by the heaters 7 to produce molecular beams. The remaining thin objective layer of the work W is thus etched completely by the molecular beams.

Importantly, the surface processing apparatus provided with the single processing chamber 13 capable of functioning for both surface processing using the charged particles and surface processing using the neutral particles can be formed in a compact construction.

Third Embodiment

Figure 3:
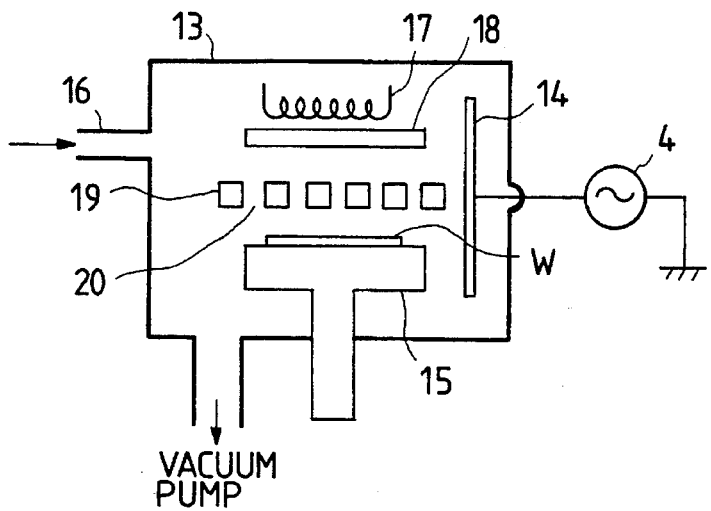
FIG. 3 is a diagrammatic view of a surface processing apparatus in a third embodiment according to the present invention.

FIG. 3 shows a surface processing apparatus in a third embodiment according to the present invention.

The surface processing apparatus in the third embodiment differs from the surface processing apparatus shown in FIG. 2 in the method of producing neutral particles, and is identical with the surface processing apparatus shown in FIG. 2 in the construction and the procedure for etching the surface of a work W with charged particles contained in a plasma in a fast etching mode. Therefore, the description of the construction and functions of the surface processing apparatus for fast etching using the plasma will be omitted.

After the completion of the fast etching process using the plasma, a reactive gas is supplied through a gas inlet 16 into a processing chamber 13 for moderate etching using neutral particles. An activating plate 18 and a heater 17 for heating the activating plate 18 are disposed within the processing chamber 13. The activating plate 18 excites the molecules of the reactive gas impinging on the surface thereof by heating the reactive gas to produce neutral particles having a high etching ability (activated molecules of the reactive gas). The neutral particles fall on the surface of the work W supported on a work support table 15 along random directions, so that the surface of the work W is subjected to isotropic etching.

If the surface of the work W needs to be subjected to anisotropic etching, a collimator 19 is disposed before the work W to collimate the paths of the neutral particles, and the collimator 19 is cooled at a low temperature. Accordingly, the activated neutral particles are cooled to the ground state and lose etching ability when the activated neutral particles impinge on the collimator 19, and only the neutral particles (activated molecules that have) that then passed through openings 20 formed in the collimator 19 contribute to etching the surface of the work W, so that the surface of the work W is etched in an anisotropic etching mode (vertical etching mode). Materials suitable for forming the activating plate 18 are quartz, ceramics and metals. The collimator 19 is formed of the same material as that forming the activating plate 18.

Fourth Embodiment

Figure 4:
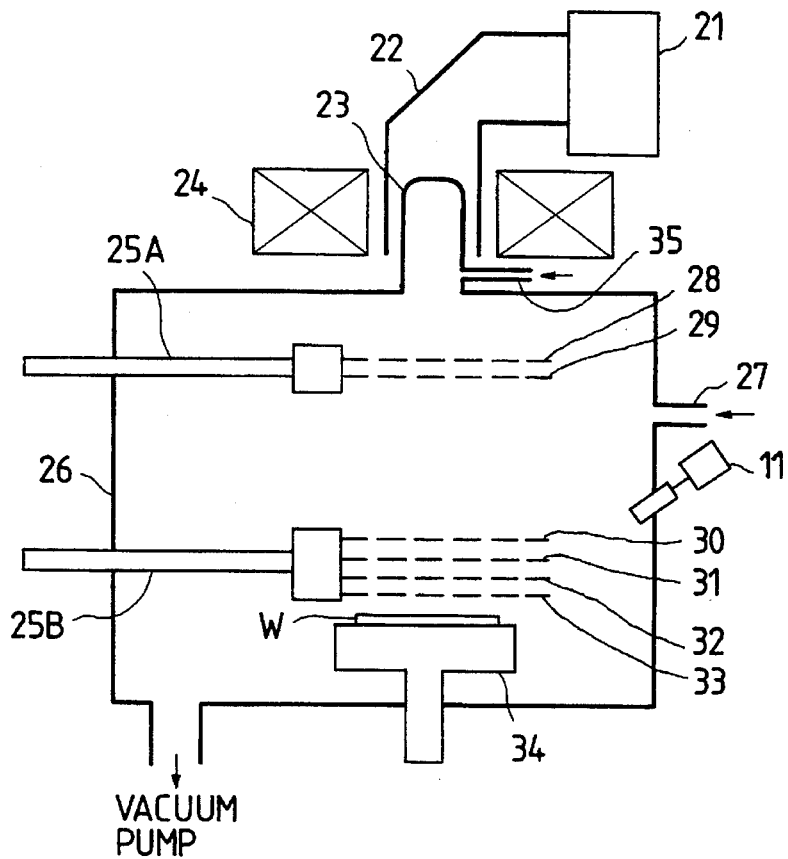
FIG. 4 is a diagrammatic view of a surface processing apparatus in a fourth embodiment according to the present invention.

FIG. 4 shows a surface processing apparatus in a fourth embodiment according to the present invention.

This surface processing apparatus uses microwave energy (generally, of frequency 2.45 GHz) for producing a plasma. Microwave energy produced by a magnetron 21 and guided by a waveguide 22 into a discharge tube 23 formed of a material that transmits electromagnetic waves, such as quartz or a ceramic, excites a gas contained in the discharge tube 23 to produce a plasma by microwave discharge. An electromagnet 24 surrounding the discharge tube 23 creates an axial magnetic field in the discharge tube 23 to make charged particles of the plasma perform circular motion in order that the time before the charged particles collide against the wall of the discharge tube 23 and become extinct may be extended.

Accelerating grids 28 and 29 for accelerating the charged particles and blocking grids 30, 31, 32 and 33 for blocking the charged particles are disposed within a processing chamber 26. The accelerating grids 28 and 29 and the blocking grids 30, 31, 32 and 33 can be shifted respectively by grid shifting mechanisms 25A and 25B between an operative position on the path of charged particles between the discharge tube 23 and a work support table 34 and an inoperative position outside the path.

In operation, a gas containing a halogen, such as $CF_4$ gas, or a mixed gas containing a halogen, oxygen and nitrogen, is supplied through a gas inlet 27 into the processing chamber 26 and, at the same time, the microwave is introduced into the discharge tube 23 to produce a plasma by microwave discharge. At this stage, the accelerating grids 28 and 29 and the blocking grids 30 to 33 are held respectively at their inoperative positions. In this state, radicals and charged particles (ions) produced in the plasma are free to fall on the surface of a work W for the fast etching of the surface of the work W.

The thickness of an objective film, i.e., a film to be etched, forming the surface of the work W is monitored by a thickness monitor 11. After the objective film has been etched to a very small thickness, the accelerating grids 28 and 29 and the blocking grids 30 to 33 are shifted respectively to their operative positions as shown in FIG. 4. A voltage is then applied across the accelerating grids 28 and 29 so that the charged particles (ions) are accelerated.

Some ions among those accelerated by the accelerating grids 28 and 29 give their charge to the neutral particles of the gas by charge exchange reaction and change into neutral particles forming beams, maintaining the kinetic energy. For example, the grids 30 and 33 are grounded, a negative voltage is applied to the grid 31 and a positive voltage is applied to the grid 32 to intercept the charged particles so that the charged particles may not fall on the surface of the work W. Accordingly, the charged particles (ions and electrons) are unable to fall on the surface of the work W, and only the beams of the neutral particles produced by charge exchange reaction and neutral radicals are allowed to fall on the surface of the work W.

The objective film is etched in a moderate etching mode mainly by the interaction of the neutral radicals and the material forming the objective film. The energy of the beams of the neutral particles enhances the interaction of the neutral radicals and the material forming the objective film.

Thus, the moderate etching mode in which the neutral radicals and the neutral particles are used for etching is established by placing the accelerating grids 28 and 29 and the blocking grids 30 to 33 respectively to their operative positions as shown in FIG. 4. The accelerating grids 28 and 29 may be held at the inoperative position in the moderate etching mode if reduction in etching rate is allowed.

The work support table 34 of the surface processing apparatus of FIG. 4 may be moved vertically by a lifting mechanism. If the work support table 34 is raised toward the lower opening of the discharge tube 23 with the accelerating grids 28 and 29 and the blocking grids 30 to 33 held respectively at the inoperative positions, a high-density plasma is available for etching. Therefore, the etching rate in the fast etching mode using the radicals and ions (charged particles) of the plasma in the initial stage of the etching process can further be increased by raising the work support table 34 toward the lower opening of the discharge tube 23. The voltages applied to the accelerating grids 28 and 29 and the blocking grids 30 to 33 may be controlled instead of shifting the same between the operative positions and the inoperative positions.

Although the neutral particles and the reactive radicals are produced from the same gas in this embodiment, they may be produce respectively from different gases. For example, neutral particles may be produced by introducing a rare gas, such as argon gas or neon gas, through a gas inlet 35 formed near the discharge tube 23 into the discharge tube 23. Reactive radicals may be produced by another discharge tube and another microwave source.

It is also possible to use such a surface processing apparatus as shown in FIG. 1, having two processing chambers, one for fast etching with a plasma produced by microwave discharge and without using any grids, and the other for moderate etching with a plasma produced by microwave discharge and by using grids. The fast etching process to be carried out in the processing chamber 1 of the surface processing apparatus shown in FIG. 1 may use a plasma produced by a microwave discharge device as shown in FIG. 4.

As is apparent from the foregoing description, the present invention uses a fast surface processing technique using charged particles and a moderate surface processing technique using neutral particles in an effective combination, in which the surface of a work is processed mostly in a fast surface processing mode using charged particles, and the surface of the work is processed in a moderate surface processing mode using neutral particles only in the final stage of the surface processing operation in which the portion of the work underlying the objective surface layer is most likely to be damaged. Accordingly, damages in the portion of the work underlying the objective surface layer can be prevented, the low surface processing rate in the moderate surface processing mode using neutral particles can be compensated, and hence a desired surface processing operation can be achieved in a significantly reduced time.

What is claimed is:

1. A surface processing method for carrying out surface treatment on a substrate, comprising the steps of: carrying out a surface treatment process using charged particles to remove a first portion of a layer overlying a substrate without exposing the substrate to the charged particles, said first portion constituting a majority of the layer, and carrying out a surface treatment process using only collimated uncharged particles to remove a second portion of the layer overlying the substrate to expose the substrate.

2. A surface processing method according to claim 1, wherein the surface treatment process using uncharged particles uses neutral particles.

3. A surface processing method according to claim 2, wherein the neutral particles are thermally excited molecules.

\* \* \* \* \*